(12) United States Patent
Lee et al.

(10) Patent No.: US 11,849,547 B2
(45) Date of Patent: Dec. 19, 2023

(54) DISPLAY DEVICE

(71) Applicant: LG ELECTRONICS INC., Seoul (KR)

(72) Inventors: Dabin Lee, Seoul (KR); Mikyung Kim, Seoul (KR); Weonyoung Sho, Seoul (KR); Sungmo Im, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 230 days.

(21) Appl. No.: 17/420,662

(22) PCT Filed: Jul. 29, 2019

(86) PCT No.: PCT/KR2019/009387
§ 371 (c)(1),
(2) Date: Jul. 2, 2021

(87) PCT Pub. No.: WO2020/213790
PCT Pub. Date: Oct. 22, 2020

(65) Prior Publication Data
US 2022/0104362 A1   Mar. 31, 2022

(30) Foreign Application Priority Data

Apr. 18, 2019   (KR) .................. 10-2019-0045729

(51) Int. Cl.
*H05K 5/02*   (2006.01)
*H05K 5/00*   (2006.01)
*H10K 50/84*   (2023.01)

(52) U.S. Cl.
CPC ......... *H05K 5/0017* (2013.01); *H05K 5/0217* (2013.01); *H10K 50/84* (2023.02)

(58) Field of Classification Search
USPC .................. 361/728, 752, 796, 800
See application file for complete search history.

(56) References Cited

U.S. PATENT DOCUMENTS

2013/0141894 A1* 6/2013 Yu ............... G02F 1/133608
                                                   362/97.2
2013/0265519 A1  10/2013 Yu
(Continued)

FOREIGN PATENT DOCUMENTS

JP        6281962      2/2018
KR      101763542      7/2017
(Continued)

OTHER PUBLICATIONS

PCT International Application No. PCT/KR2019/009387, International Search Report dated Jan. 17, 2020, 5 pages.

*Primary Examiner* — Hung S. Bui
(74) *Attorney, Agent, or Firm* — LEE, HONG, DEGERMAN, KANG & WAIMEY PC (57) ABSTRACT

A display device is disclosed. The display device includes a display panel; a main frame disposed behind the display panel; and an inner plate positioned between the display panel and the main frame and coupled to the main frame. The main frame includes at least one first through hole that passes through a thickness of the main frame in a first area. The inner plate includes at least one first protrusion inserted into the at least one first through hole in the first area, and a first extension extended from an end of the at least one first protrusion along an outward direction of a central axis of the at least one first protrusion.

12 Claims, 10 Drawing Sheets

(56) References Cited

U.S. PATENT DOCUMENTS

| | | | |
|---|---|---|---|
| 2014/0063400 A1* | 3/2014 | Wang | G02F 1/133308 |
| | | | 349/58 |
| 2018/0184534 A1* | 6/2018 | Na | H05K 5/0234 |
| 2019/0029129 A1* | 1/2019 | Kang | H05K 5/0247 |
| 2021/0048857 A1* | 2/2021 | Kang | G06F 1/181 |
| 2021/0202892 A1* | 7/2021 | Kim | H10K 99/00 |

FOREIGN PATENT DOCUMENTS

| | | |
|---|---|---|
| KR | 1020190004954 | 1/2019 |
| KR | 1020190010073 | 1/2019 |

* cited by examiner

DISPLAY DEVICE

CROSS-REFERENCE TO RELATED APPLICATIONS

This application is the National Stage filing under 35 U.S.C. 371 of International Application No. PCT/KR2019/009387, filed on Jul. 29, 2019, which claims the benefit of earlier filing date and right of priority to Korean Patent Application No. 10-2019-0045729, filed on Apr. 18, 2019, the contents of which are all incorporated by reference herein in their entirety.

TECHNICAL FIELD

The present disclosure relates to a display device. More specifically, the present disclosure relates to a display device including a case member with a solid coupling structure.

BACKGROUND ART

With the development of the information society, various types of demands for display devices are increasing. Various display devices such as a liquid crystal display (LCD), a plasma display panel (PDP), an electroluminescent display (ELD), a vacuum fluorescent display (VFD), and an organic light emitting diode (OLED) display have been recently studied and used in response to the various types of demands.

Out of the various display devices, an OLED panel can display an image by depositing an organic layer, which is able to emit light by itself, on a substrate on which transparent electrodes are formed. The OLED panel can have a thin profile and flexible characteristics. Many studies have been made on structural characteristics of display devices including the OLED panel described above.

DISCLOSURE

Technical Problem

An object of the present disclosure is to address the above-described and other problems. Another object of the present disclosure is to reduce a thickness of a display device.

Another object of the present disclosure is to secure a solid coupling strength of a case member constituting a display device Another object of the present disclosure is to simplify an assembly process of a display device.

Another object of the present disclosure is to reduce the manufacturing cost of a display device.

Technical Solution

To achieve the above-described and other objects, in one aspect of the present disclosure, there is provided a display device comprising a display panel; a main frame disposed behind the display panel; and an inner plate positioned between the display panel and the main frame and coupled to the main frame, wherein the main frame includes at least one first through hole that passes through a thickness of the main frame in a first area, wherein the inner plate includes at least one first protrusion inserted into the at least one first through hole in the first area; and a first extension extended from an end of the at least one first protrusion along an outward direction of a central axis of the at least one first protrusion.

According to another aspect of the present disclosure, the first extension may contact a rear surface of the main frame.

According to another aspect of the present disclosure, the display device may further comprise a middle frame including a sidewall facing a side of the display panel, and a base portion extended from the sidewall and facing a rear surface of the main frame at a rear of the main frame. The main frame may include at least one 2-1 through hole that passes through the thickness of the main frame in a second area, and the base portion may include at least one 2-2 through hole that passes through a thickness of the base portion in the second area. The inner plate may include at least one second protrusion inserted into the at least one 2-1 through hole and the at least one 2-2 through hole in the second area; and a second extension extended from an end of the at least one second protrusion along an outward direction of a central axis of the at least one second protrusion.

According to another aspect of the present disclosure, the second extension may contact a rear surface of the base portion.

According to another aspect of the present disclosure, the base portion may include at least one third through hole that passes through the thickness of the base portion in a third area. The main frame may include at least one third protrusion inserted into the at least one third through hole; and a third extension extended from an end of the at least one third protrusion along an outward direction of a central axis of the at least one third protrusion.

According to another aspect of the present disclosure, the third extension may contact a rear surface of the base portion.

According to another aspect of the present disclosure, the display device may further comprise a source printed circuit board (PCB) positioned on the rear surface of the main frame; and a member layer configured to electrically connect the display panel to the source PCB. The main frame and the base portion of the middle frame each may include a first opening and a second opening through which the member layer passes. The at least one third protrusion may be disposed avoiding the first opening and the second opening.

According to another aspect of the present disclosure, wherein at least one of the at least one first protrusion, the at least one second protrusion, and the at least one third protrusion may be penetrated in a thickness direction.

According to another aspect of the present disclosure, the display device may comprise a first long side area, a second long side area opposite to the first long side area, a first short side area abutting an end of the first long side area and an end of the second long side area, a second short side area opposite to the first short side area, and a central area between the first and second long side areas and the first and second short side areas. The first area may be positioned in the central area. The second area may be positioned in at least one of the first long side area, the first short side area, and the second short side area. The third area may be positioned in the second long side area.

According to another aspect of the present disclosure, the display device may further comprise adhesive members between the display panel and the inner plate. The adhesive members may include first adhesive members extending in a horizontal direction to the first and second long side areas, second adhesive members extending in a vertical direction to the first and second short side areas, and third adhesive members extending in a horizontal direction to the central area.

According to another aspect of the present disclosure, the at least one first protrusion, the at least one second protrusion, and the at least one third protrusion may overlap the adhesive members.

According to another aspect of the present disclosure, the at least one first protrusion, the at least one second protrusion, and the at least one third protrusion may be positioned between the adhesive members.

Advantageous Effects

According to at least one aspect of the present disclosure, the present disclosure can provide a display device including case members that are tightly coupled.

According to at least one aspect of the present disclosure, the present disclosure can provide a display device capable of improving a manufacturing yield by simplifying a manufacturing process.

According to at least one aspect of the present disclosure, the present disclosure can provide a display device capable of reducing the manufacturing cost.

Further scope of applicability of the present disclosure will become apparent from the detailed description given blow. However, it should be understood that the detailed description and specific examples, while indicating embodiments of the disclosure, are given by illustration only, since various changes and modifications within the spirit and scope of the present disclosure will become apparent to those skilled in the art from this detailed description.

MODE FOR INVENTION

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the present disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

The terms including an ordinal number such as first, second, etc. may be used to describe various components, but the components are not limited by such terms. The terms are used only for the purpose of distinguishing one component from other components.

When any component is described as "connected to" or "coupled to" another component, this should be understood to mean that still other component(s) may exist between them, although any component may be directly connected to or directly coupled to another component. In contrast, when any component is described as "directly connected to" or "directly coupled to" another component, this should be understood to mean that no component exists between them.

A singular expression can include a plural expression as long as it does not have an apparently different meaning in context.

In the present disclosure, the terms "include" or "have" should be understood to be intended to designate that illustrated features, numbers, steps, operations, components, parts or combinations thereof are present and not to preclude the existence of one or more different features, numbers, steps, operations, components, parts or combinations thereof, or the possibility of the addition thereof.

Hereinafter, embodiments of the present disclosure are described using an organic light emitting diode (OLED) display panel as an example of a display panel 110. However, embodiments of the present disclosure are not limited thereto. For example, a plasma display panel (PDP), a field emission display (FED) panel, and a liquid crystal display (LCD) panel may be used.

FIGS. 1 to 4 illustrate examples of a display device according to an embodiment of the present disclosure.

Figure 1:
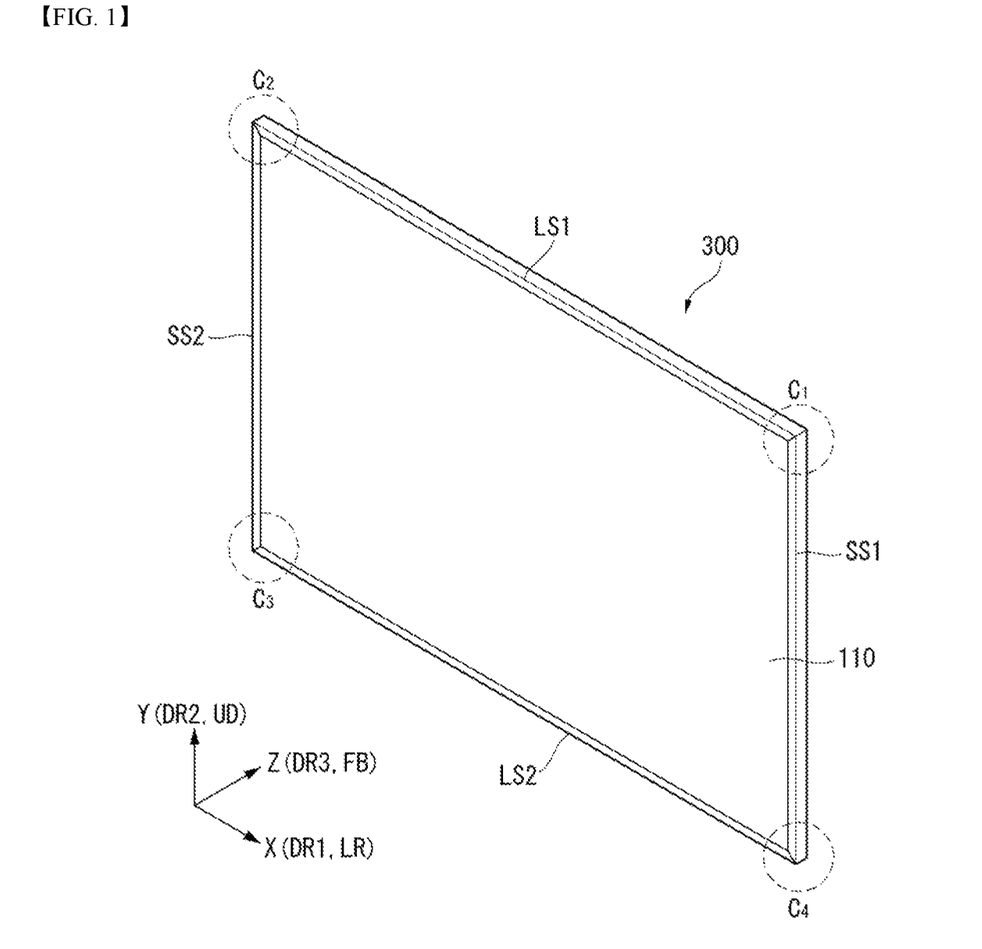
FIGS. 1 to 4 illustrate a display device according to an embodiment of the present disclosure.

Referring to FIG. 1, a display device 300 may include a first long side LS1, a second long side LS2 opposite the first long side LS1, a first short side SS1 adjacent to the first long side LS1 and the second long side LS2, and a second short side SS2 opposite the first short side SS1.

In the display device 300, the first short side SS1 may be referred to as a first side area, and the second short side SS2 may be referred to as a second side area opposite the first side area. In addition, the first long side LS1 may be referred to as a third side area which is adjacent to the first side area and the second side area and is positioned between the first side area and the second side area, and the second long side LS2 may be referred to as a fourth side area which is adjacent to the first side area and the second side area, is positioned between the first side area and the second side area, and is opposite to the third side area.

Embodiments of the present disclosure illustrate and describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of a display panel 110, and a second direction DR2 may be a direction parallel to the short sides SS1 and SS2 of the display panel 110. Further, a third direction DR3 may be a direction perpendicular to the first direction DR1 and/or the second direction DR2.

A side on which the display device 300 displays an image may be referred to as a forward direction or a front surface. When the display device 300 displays an image, a side at which the image cannot be observed may be referred to as a rearward direction or a rear surface. When the display device 300 is observed at the forward direction or the front surface, the first long side LS1 may be referred to as an upper side or an upper surface, and the second long side LS2 may be referred to as a lower side or a lower surface. When the display device 300 is observed at the forward direction or the front surface, the first short side SS1 may be referred to as a right side or a right surface, and the second short side SS2 may be referred to as a left side or a left surface.

Further, the first long side LS1, the second long side LS2, the first short side SS1, and the second short side SS2 may be referred to as edges of the display device 300. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR or a horizontal direction DR1. A direction from the first long side LS1 to the second long side LS2 or from the second long side LS2 to the first long side LS1 may be referred to as an up-down direction UD or a vertical direction DR2.

In embodiments disclosed herein, a direction from the front side to the rear side or a direction from the rear side to the front side may be referred to as a front-rear direction DR3 or a thickness direction FB. The front-rear direction DR3 may be a direction perpendicular to a left-right direction DR1 and/or an up-down direction DR2.

Figure 2:
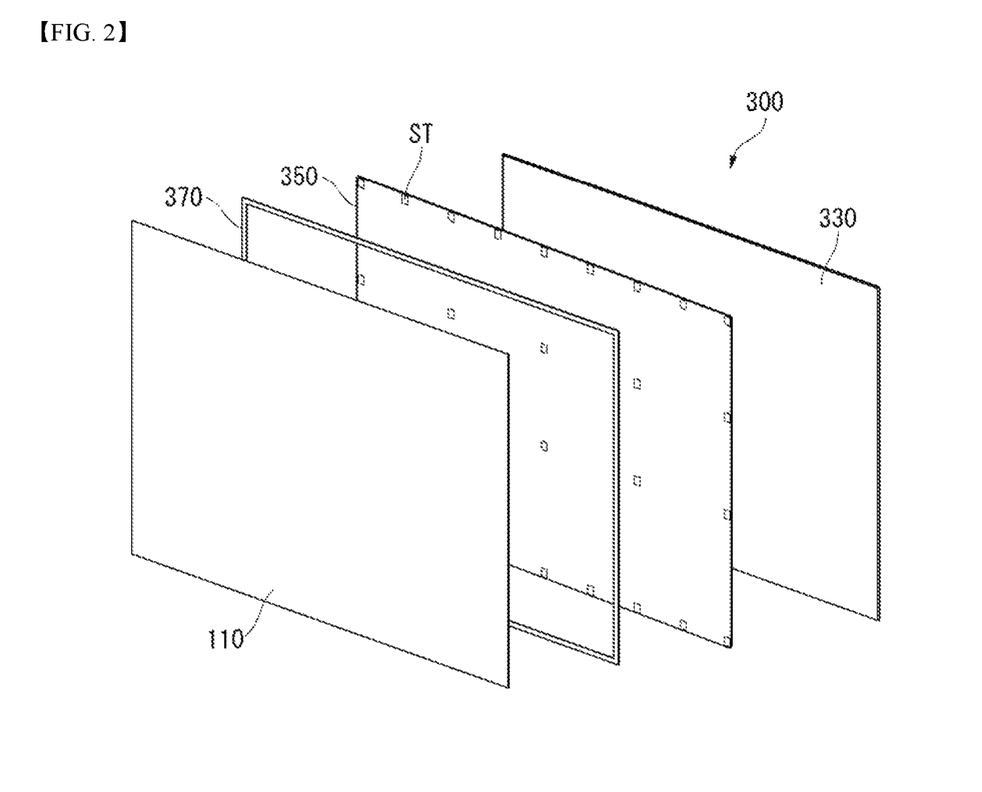
Figure 3:
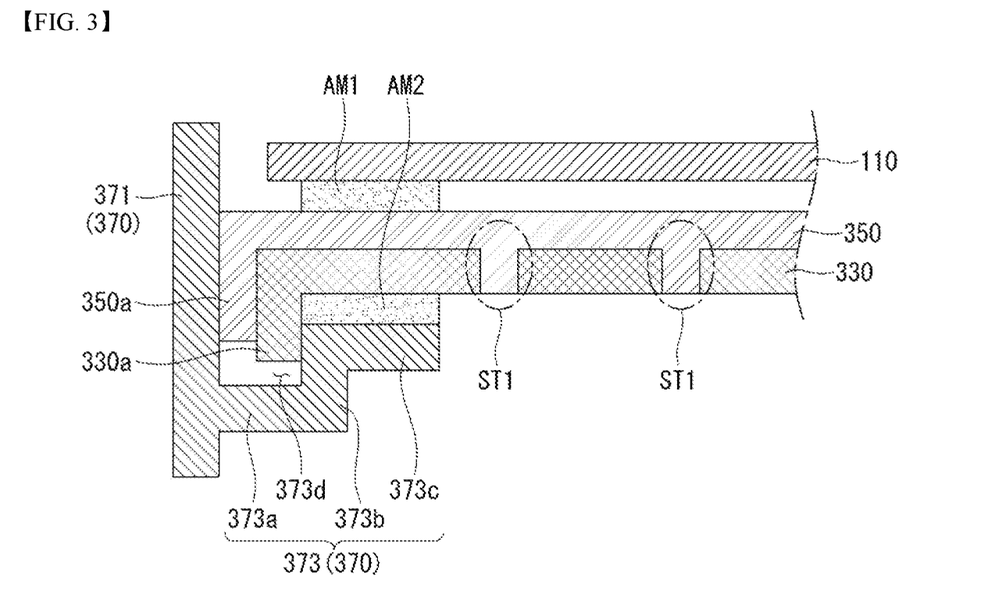
Figure 4:
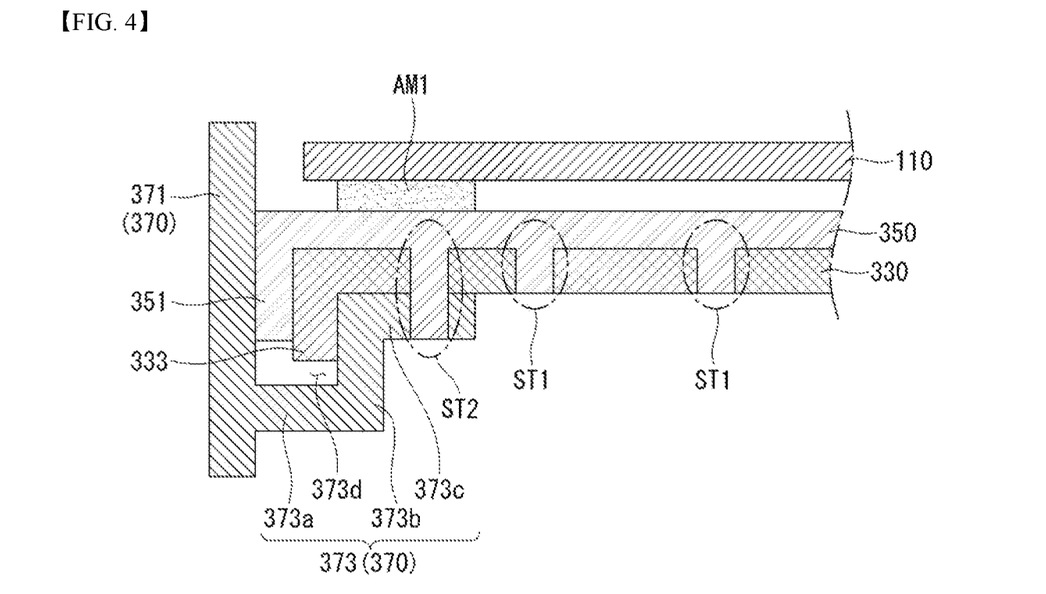

Referring to FIGS. 2 to 4, the display device 300 may include the display panel 110, a main frame 330, an inner plate 350, and a middle frame 370.

The display panel 110 may be provided on a front surface of the display device 300 and may display an image. The display panel 110 may divide an image into a plurality of pixels and adjust hue, brightness and saturation for each pixel to output the image. The display panel 110 may be divided into an active area on which the image is displayed, and a de-active area on which the image is not displayed. The display panel 110 may generate light corresponding to red, green, or blue color in response to a control signal.

The main frame 330 may be disposed behind the display panel 110. The main frame 330 may face a rear surface of the display panel 110 at the rear of the display panel 110. An edge of the main frame 330 may be bent at least once, but embodiments are not limited thereto.

The inner plate 350 may be disposed behind the display panel 110. The inner plate 350 may be disposed between the display panel 110 and the main frame 330. A front surface of the inner plate 350 may face the display panel 110. The inner plate 350 may be coupled to the main frame 330.

As will be described later, the inner plate 350 may be in-mold coupled to the main frame 330 without further including a separate coupling member. An in-mold coupling structure of the inner plate 350 and the main frame 330 may be referred to as a first coupling structure ST1. Since the present disclosure does not need to include a separate member for coupling a plurality of members, the present disclosure has advantages of simplifying an assembly structure and an assembly process, improving a manufacturing yield, and reducing the material cost. In addition, since the present disclosure does not need to assign a separate space for disposing a separate coupling member, the present disclosure has advantages of providing a display device with a thinner profile.

The inner plate 350 may support the display panel 110 at the rear of the display panel 110. A first adhesive member AM1 may be positioned between the inner plate 350 and the display panel 110. The first adhesive member AM1 may fix the inner plate 350 and the display panel 110 to each other. The first adhesive member AM1 may be a double-sided tape, but embodiments are not limited thereto.

The middle frame 370 may include a base portion 373 and a sidewall 371. The sidewall 371 may be integrally formed with the base portion 373, or may be formed separately from the base portion 373 and then coupled to the base portion 373. In order to secure a predetermined rigidity, it may be preferable that the sidewall 371 and the base portion 373 are integrally formed.

The sidewall 371 may be elongated to cover the side surface of the display panel 110. The sidewall 371 may face the side surface of the display panel 110 to constrain the movement of the display panel 110 and/or restrict the movement of the display panel 110 within a predetermined range.

The base portion 373 may extend from the sidewall 371. The base portion 373 may be disposed behind the main frame 330 and face a rear surface of the main frame 330. The base portion 373 may extend from the rear of the main frame 330 in an inward direction and cover at least one edge of the main frame 330.

The base portion 373 may be coupled to the main frame 330 at the rear of the main frame 330. As illustrated in FIG. 3, a second adhesive member AM2 may be positioned between the base portion 373 and the main frame 330. The second adhesive member AM2 may fix the base portion 373 and the main frame 330 to each other. The second adhesive member AM2 may be a double-sided tape, but embodiments are not limited thereto.

As another example, as illustrated in FIG. 4, the base portion 373 may be simultaneously coupled to the main frame 330 and the inner plate 350 at the rear of the main frame 330. This means that a more stable coupling strength can be secured as a plurality of members are simultaneously coupled. As will be described later, the base portion 373 may be in-mold coupled to the main frame 330 and the inner plate 350 without further including a separate coupling member. An in-mold coupling structure of the base portion 373, the main frame 330, and the inner plate 350 may be referred to as a second coupling structure ST2. Since the present disclosure does not need to include a separate member for coupling a plurality of members, the present disclosure has advantages of simplifying the assembly structure and the assembly process, improving the manufacturing yield, and reducing the material cost. In addition, since the present disclosure does not need to assign a separate space for disposing a separate coupling member, the present disclosure has advantages of providing a display device with a thinner profile.

One edge of the inner plate 350 and one edge of the main frame 330 may be seated in an inner space provided by the base portion 373 and the sidewall 371. The inner plate 350, the main frame 330, and the middle frame 370 have a predetermined arrangement structure in the inner space, and thus can secure a more stable coupling strength.

For example, at least one end of the inner plate 350 may include a first stepped portion 350a that is bent in a rear direction and is directed toward the rear direction. At least one end of the main frame 330 may include a second stepped portion 330a that is bent in the rear direction and is directed toward the rear direction. That is, the first stepped portion 350a and the second stepped portion 330a may extend in the same direction and contact each other. Hence, the inner plate 350 and the main frame 330 can constrain and restrict their movement to each other.

As another example, the base portion 373 may further include a bending portion for securing a predetermined seating area. The base portion 373 may include, for example, a first portion 373a, a second portion 373b, and a third portion 373c. The first portion 373a may be extended from the sidewall 371 and directed toward the inward direction. The second portion 373b may be extended from the first portion 373a, bent at least once, and directed toward the front direction. The third portion 373c may be extended from the second portion 373b, bent at least once, and directed toward the inward direction. An inner space provided by the first to third portions 373a to 373c may be referred to as an insertion portion 373d. The first stepped portion 350a of the inner plate 350 may be extended in the rearward direction and inserted into the insertion portion 373d. Hence, the movement of the inner plate 350 may be constrained or restricted within a predetermined range. The second stepped portion 330a of the main frame 330 may be extended in the rearward direction and inserted into the insertion portion 373d. Hence, the movement of the main frame 330 may be constrained or restricted within a predetermined range.

Figure 5:
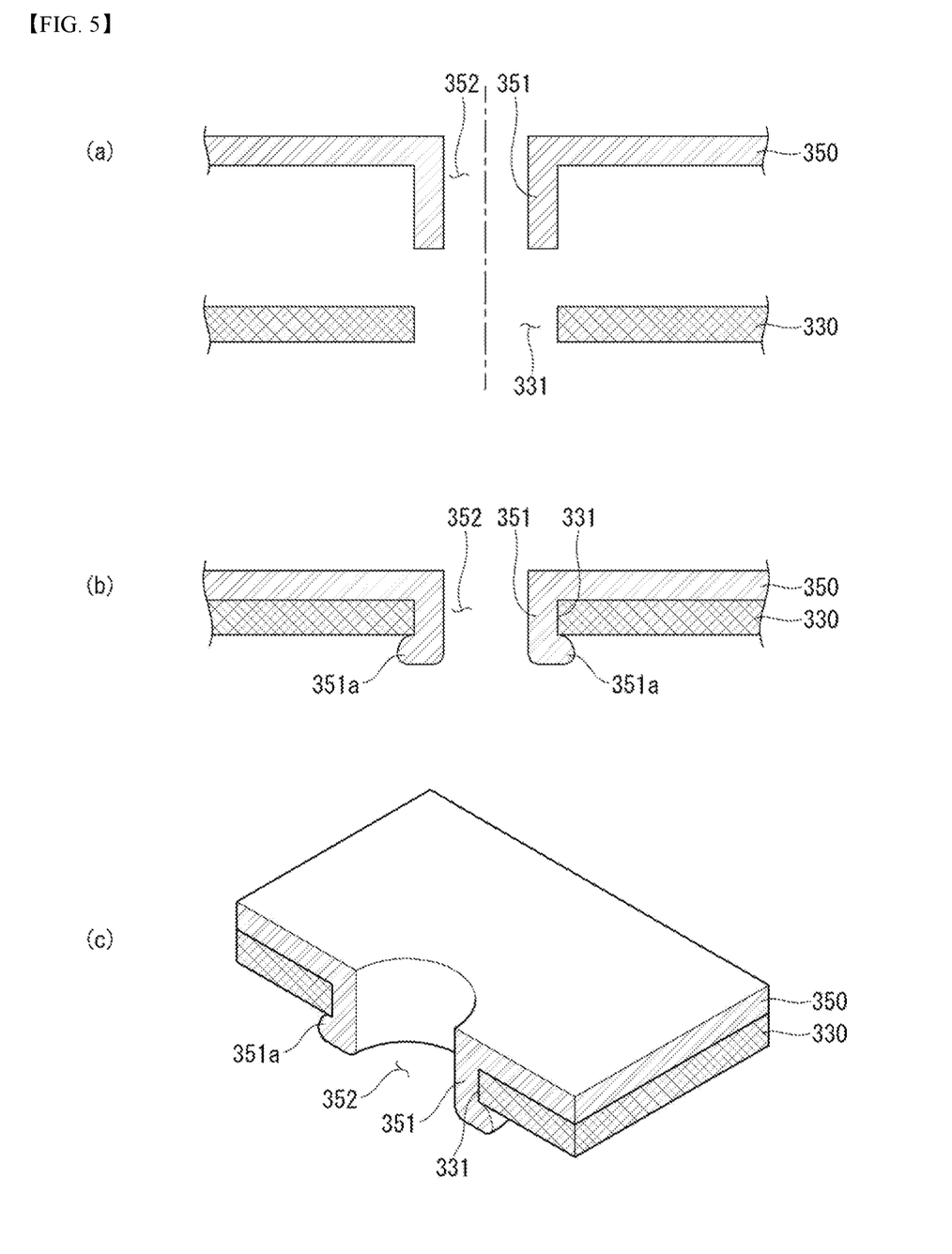
FIGS. 5 to 7 illustrate an example of a coupling structure according to an embodiment of the present disclosure.
Figure 6:
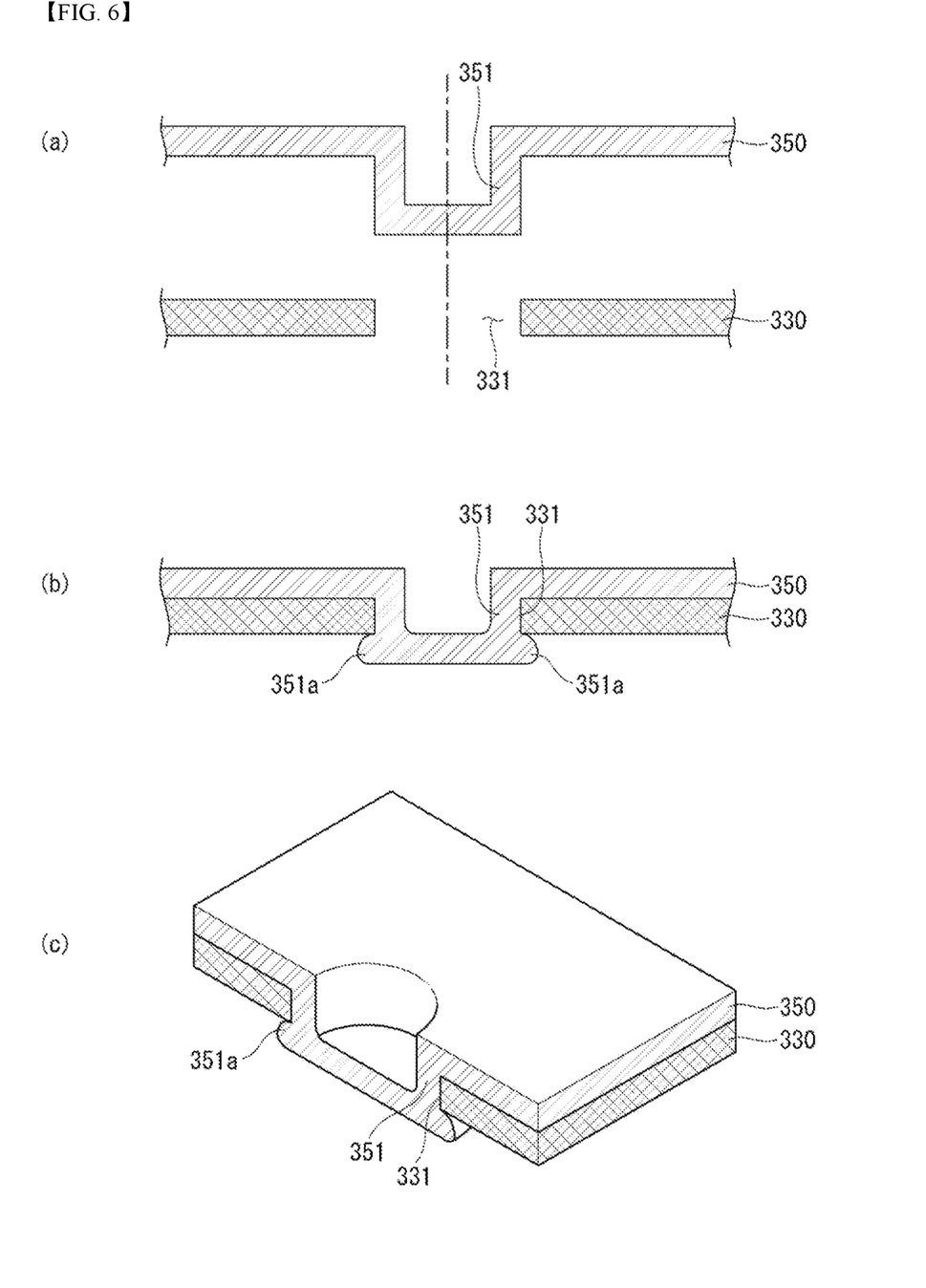
Figure 7:
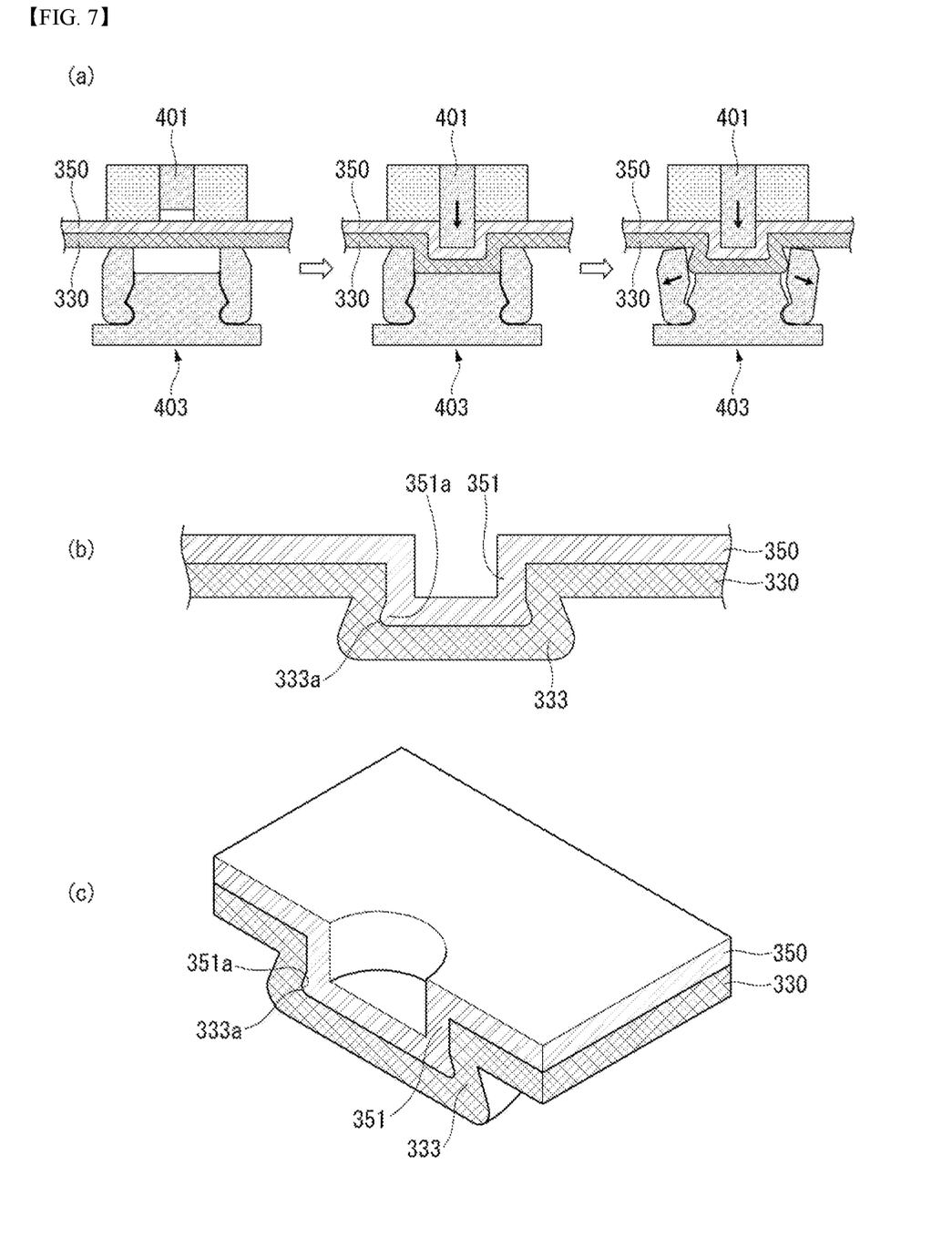

FIGS. 5 to 7 illustrate an example of a coupling structure according to an embodiment of the present disclosure.

The coupling structure may be the first coupling structure ST1 and may be the second coupling structure ST2. The coupling structure includes a first base material and a second base material that are in-mold coupled. Hereinafter, for convenience of explanation, the case where the first base material and the second base material are the main frame 330 and the inner plate 350 is described as an example, but embodiments are not limited thereto. For example, the first base material may be any one of the main frame 330, the inner plate 350, and the middle frame 370, and the second base material may be another of the main frame 330, the inner plate 350, and the middle frame 370. Alternatively, the coupling structure may further include one or more base materials. For example, the first base material may be any one of the main frame 330, the inner plate 350, and the middle frame 370, the second base material may be another of the main frame 330, the inner plate 350, and the middle frame 370, and the third base material may be a reminder of the main frame 330, the inner plate 350, and the middle frame 370. As will be described later, case members constituting the display device may have different coupling structures depending on a position. In embodiments disclosed herein, examples of the case members may include the main frame 330, the inner plate 350, and the middle frame 370.

Referring to FIG. 5, the main frame 330 may include a through hole 331 that is penetrated in the thickness direction. The inner plate 350 may include a hollow protrusion 351 protruding toward the through hole 331 of the main frame 330. The hollow protrusion 351 may be formed by recessing a part of the inner plate 350 at the front surface and protruding it at the rear surface. As the hollow protrusion 351 is inserted into the through hole 331, the inner plate 350 and the main frame 330 may be fixed to each other.

More specifically, an outer circumference of the hollow protrusion 351 may correspond to a shape of the through hole 331. That is, it may be preferable that the outer circumference of the hollow protrusion 351 is in a circular shape. The hollow protrusion 351 may have a cylindrical shape with a hollow 352 that passes through the inside of the hollow protrusion 351 in the thickness direction. The hollow protrusion 351 may be molded through a burring process. The hollow protrusion 351 may be inserted into the through hole 331. An end of the hollow protrusion 351 may be inserted into the through hole 331, and then may be caulked so that the end is compulsorily caught on the rear surface of the main frame 330 at the periphery of the through hole 331. As the end of the hollow protrusion 351 is caulked, a portion that is extended from the end of the hollow protrusion 351 and contacts the rear surface of the main frame 330 may be referred to as an extension 351a. The extension 351a may have a shape that protrudes about a central axis of the hollow protrusion 351 in an outward direction. A cross section of the hollow protrusion 351 may have a C-shape in a portion in which the extension 351a is provided.

As illustrated in (a) of FIG. 5, embodiments of the present disclosure can provide a coupling strength between the inner plate 350 and the main frame 330 by pressurizing the end of the hollow protrusion 351 inserted into the through hole 331 and locally molding and deforming it. Hence, since the hollow protrusion 351 inserted into the through hole 331 can be prevented from being detached, the present disclosure can maintain a solid coupling state between the inner plate 350 and the main frame 330 without using a separate coupling member. This means that a mutual movement between the inner plate 350 and the main frame 330 can be constrained and/or restricted.

Referring to FIG. 6, the main frame 330 may include a through hole 331 that is penetrated in the thickness direction. The inner plate 350 may include an embossing protrusion 351 protruding toward the through hole 331 of the main frame 330. The embossing protrusion 351 may be formed by recessing a part of the inner plate 350 at the front surface and protruding it at the rear surface. As the embossing protrusion 351 is inserted into the through hole 331, the inner plate 350 and the main frame 330 may be fixed to each other.

More specifically, an outer circumference of the embossing protrusion 351 may correspond to a shape of the through hole 331. That is, it may be preferable that the outer circumference of the embossing protrusion 351 is in a circular shape. A hollow may not be provided inside the embossing protrusion 351, unlike the hollow protrusion 351 of FIG. 5. In this case, there is an advantage of preventing a light leakage defect that may occur due to the hollow. The embossing protrusion 351 may be inserted into the through hole 331. An end of the embossing protrusion 351 may be inserted into the through hole 331, and then may be caulked so that the end is compulsorily caught on the rear surface of the main frame 330 at the periphery of the through hole 331. As the end of the embossing protrusion 351 is caulked, a portion that is extended from the end (or bottom) of the embossing protrusion 351 and contacts the rear surface of the main frame 330 may be referred to as an extension 351a. The extension 351a may have a shape that protrudes about a central axis of the embossing protrusion 351 in the outward direction. A cross section of the embossing protrusion 351 may have a C-shape in a portion in which the extension 351a is provided.

As illustrated in (a) of FIG. 6, embodiments of the present disclosure can provide a coupling strength between the inner plate 350 and the main frame 330 by pressurizing the end of the embossing protrusion 351 inserted into the through hole 331 and locally molding and deforming it. Hence, since the embossing protrusion 351 inserted into the through hole 331 can be prevented from being detached, the present disclosure can maintain a solid coupling state between the inner plate 350 and the main frame 330 without using a separate coupling member. This means that a mutual movement between the inner plate 350 and the main frame 330 can be constrained and/or restricted.

Referring to FIG. 7, the inner plate 350 may include a first embossing protrusion 351 protruding to the rear toward the main frame 330. The main frame 330 may include a second embossing protrusion 333 protruding in the same direction as the protruding direction of the first embossing protrusion 351. The first embossing protrusion 351 may be formed by recessing a part of the inner plate 350 at the front surface and protruding it at the rear surface. The second embossing protrusion 333 may be formed by recessing a part of the main frame 330 at the front surface and protruding it at the rear surface. The first embossing protrusion 351 may be inserted into a recessed portion of the second embossing protrusion 333. To this end, a cross-sectional area of the first embossing protrusion 351 may be less than a cross-sectional area of the second embossing protrusion 333. The first embossing protrusion 351 may include an extension 351a having a shape that protrudes about a central axis of the first embossing protrusion 351 in the outward direction. The second embossing protrusion 333 may be formed along an outer circumference of the first embossing protrusion 351. An outer circumferential shape of the first embossing protrusion 351 may correspond to an inner circumferential shape of the second embossing protrusion 333. Thus, the second embossing protrusion 333 may include a groove 333a into which the extension 351a is inserted. A shape of the extension 351a may correspond to a shape of the groove 333a. Thus, the extension 351a and the groove 333a may contact each other and may be engaged with each other.

As illustrated in (a) of FIG. 7, embodiments of the present disclosure can form the first embossing protrusion 351 with the extension 351a and the second embossing protrusion 333 with the groove 333a by simultaneously pressurizing the inner plate 350 and the main frame 330, that are sequentially stacked, in the downward direction and locally molding and deforming them, thereby providing a coupling strength between the inner plate 350 and the main frame 330. The shapes of the extension 351a and the groove 333a may be controlled by shapes of a pressing device 401 and a die 403. Hence, since the first embossing protrusion 351 inserted into the second embossing protrusion 333 can be prevented from being detached, embodiments of the present disclosure can maintain a solid coupling state between the inner plate 350 and the main frame 330 without using a separate coupling member. This means that a mutual movement between the inner plate 350 and the main frame 330 can be constrained and/or restricted.

Figure 8:
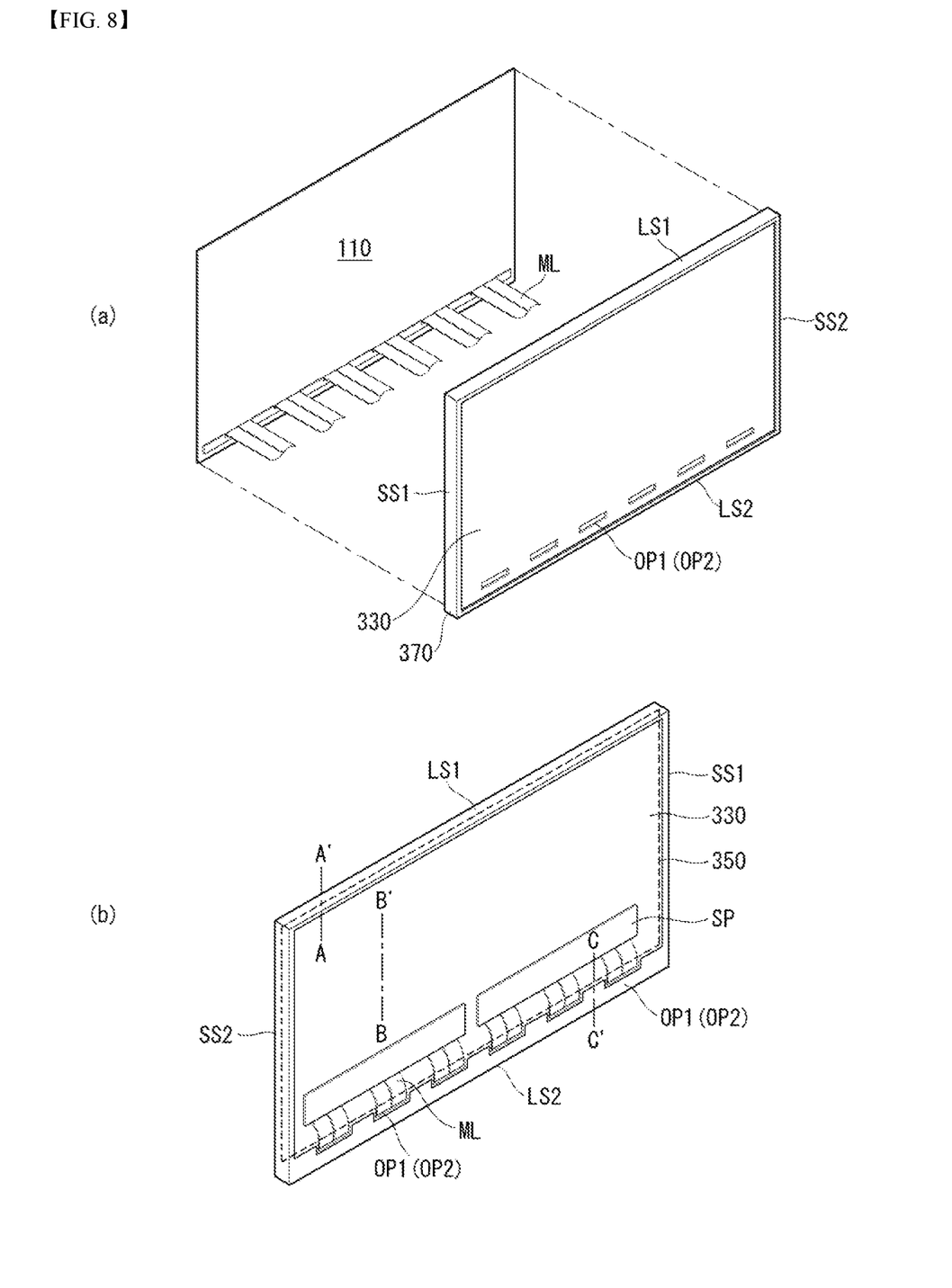
FIGS. 8 to 11 illustrate examples of a coupling structure according to an embodiment of the present disclosure.
Figure 9:
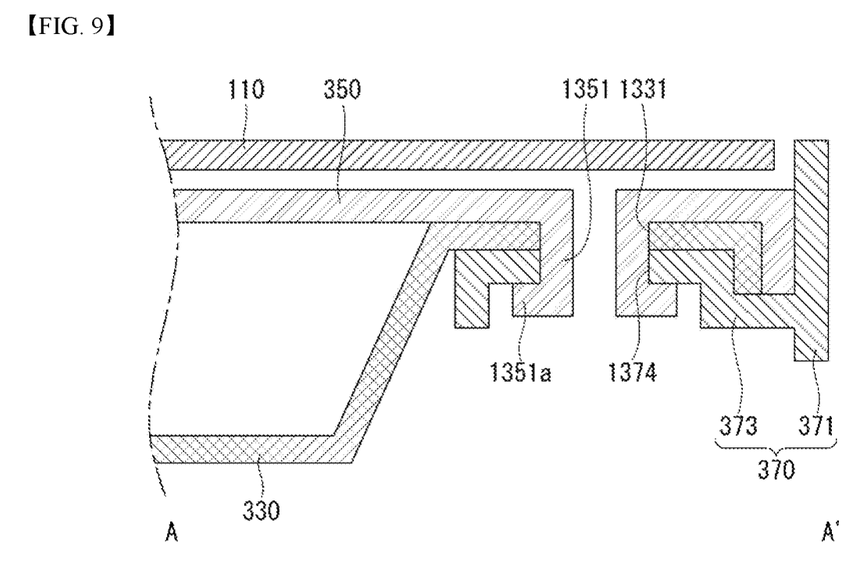
Figure 10:
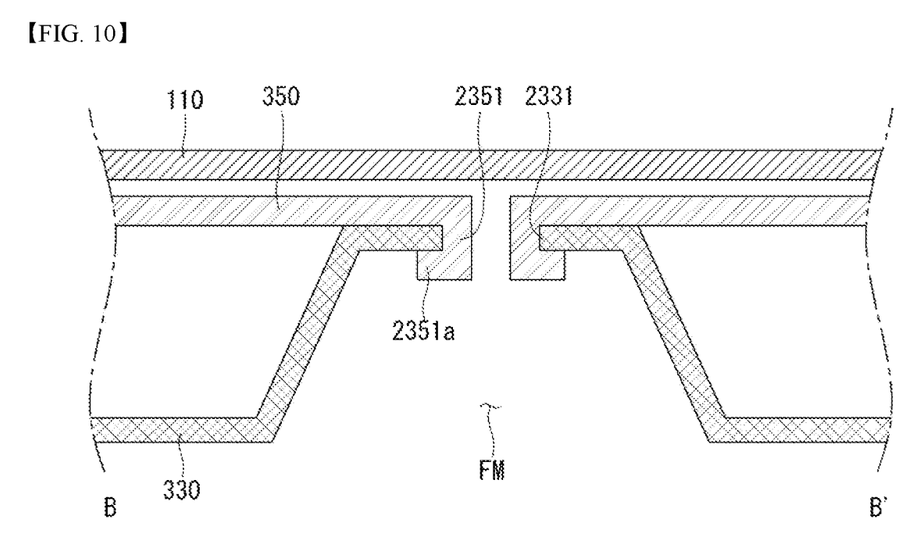
Figure 11:
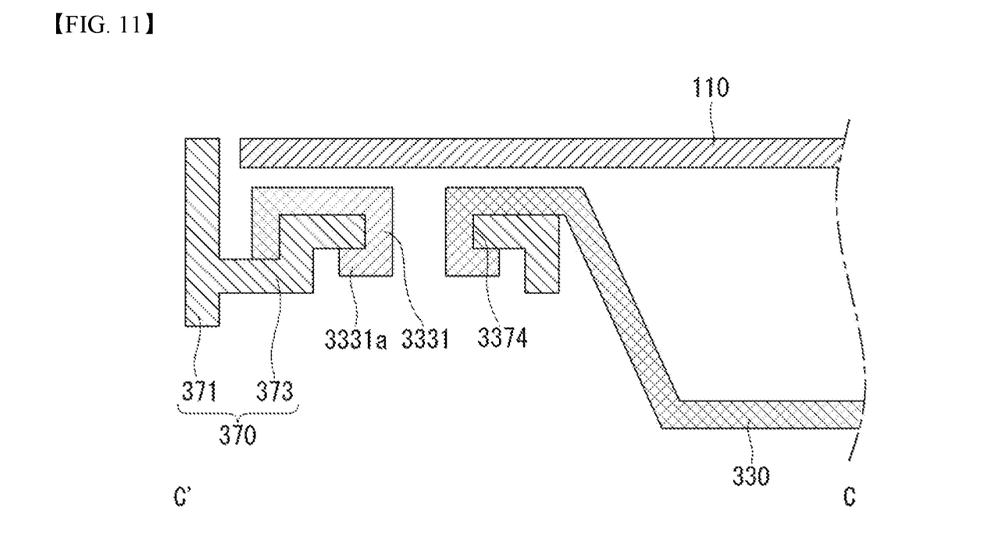

FIGS. 8 to 11 illustrate detailed application examples of a coupling structure according to an embodiment of the present disclosure. More specifically, FIG. 9 illustrates a display device taken along A-A' of FIG. 8. FIG. 10 illustrates a display device taken along B-B' of FIG. 8. FIG. 11 illustrates a display device taken along C-C' of FIG. 8. Hereinafter, the coupling structure illustrated in FIG. 5 may be used to describe the coupling structure of the case members, by way of example. However, embodiments are not limited thereto. For example, the coupling structures illustrated in FIGS. 6 and 7 may be used.

Referring to FIG. 8, a display device according to an embodiment of the present disclosure may include a display panel 110 and a case member. The case member may include a main frame 330, an inner plate 350, and a middle frame 370. The display panel 110 may be assembled with the case members and implemented as one module.

The display panel 110 may include a member layer ML. For example, the display panel 110 may be an OLED panel, and the member layer ML may be a chip-on-film (COF), a flexible printed circuit board (FPCB), a tape carrier package (TCP), etc. The member layer ML may be extended to a read surface of the display panel 110 at a lower end of the display panel 110 (e.g., a portion corresponding to the second long side LS2 of the display device).

Each of the main frame 330 and the middle frame 370 may include a first opening OP1 and a second opening OP2. The first opening OP1 and the second opening OP2 may be disposed corresponding to the lower end of the display panel 110 (e.g., the portion corresponding to the second long side LS2 of the display device). The first opening OP1 may completely pass through the main frame 330. The second opening OP2 may completely pass through the middle frame 370. The member layer ML may pass through the first opening OP1 and the second opening OP2 and extend toward the rear. The number of first and second openings OP1 and OP2 may correspond to the number of member layers ML. The member layer ML that passes through the first opening OP1 and the second opening OP2 and is extended may be connected to a source printed circuit board (PCB) SP disposed behind the main frame 330 and may receive a predetermined signal. As illustrated, one source PCB SP may be connected to the plurality of member layers ML, but embodiments are not limited thereto.

A plurality of coupling structures for coupling the case members may be applied to M columns and N rows, where M and N are a natural number.

More specifically, referring to FIG. 9, the main frame 330, the inner plate 350, and the middle frame 370 may be simultaneously coupled through one coupling structure. The corresponding coupling structure may be applied corresponding to an upper end, a left end, and a right end of the display device. In other words, the corresponding coupling structure may be applied corresponding to the first long side LS1, the first short side SS1, and the second short side SS2 of the display device.

A display device according to an embodiment of the present disclosure may include a main frame 330, an inner plate 350, and a middle frame 370.

The inner plate 350 may include one or more protrusions 1351 that protrude from a side end toward the rear. The main frame 330 may include a first through hole 1331 that contacts a rear surface of the inner plate 350 at the rear of the inner plate 350, and the protrusion 1351 may be inserted into the first through hole 1331. A base portion 373 of the middle frame 370 may include a second through hole 1374 that contacts a rear surface of the main frame 330 at the rear of the main frame 330, and the protrusion 1351 may be inserted into the second through hole 1374. The number of protrusions 1351, the number of first through holes 1331, and the number of second through holes 1374 may correspond to each other.

An end of the protrusion 1351 may include an extension 1351a. The extension 1351a may be bent from one end of the protrusion 1351 and may contact a rear surface of the base portion 373 of the middle frame 370 at the periphery of the second through hole 1374. Hence, movements of the main frame 330 and the middle frame 370 in the thickness direction can be constrained and/or restricted. It is a matter of course that a movement of the inner plate 350 can be constrained and/or restricted by the main frame 330 and the middle frame 370.

A plurality of such coupling structures may be provided along at least one direction. Hence, not only the movements of the main frame 330, the inner plate 350, and the middle frame 370 in the thickness direction but also their movements in the vertical and horizontal directions can be constrained and/or restricted. Since embodiments of the present disclosure do not use a separate adhesive member, such as a tape, for fixing the case members, they can prevent a problem in that the coupling strength is reduced depending on changes in temperature/humidity in the use environment and/or the manufacturing environment. In addition, since embodiments of the present disclosure fix a plurality of members using one coupling structure, they can secure a more robust coupling strength.

Referring to FIG. 10, the main frame 330 and the inner plate 350 may be coupled through one coupling structure. The corresponding coupling structure may be applied correspondingly to the center of the display device. The center of the display device may correspond to an area in which the middle frame 370 is not disposed.

The inner plate 350 may include one or more protrusions 2351 that protrude from the center toward the rear. The main frame 330 may include a through hole 2331 that contacts the rear surface of the inner plate 350 at the rear of the inner plate 350, and the protrusion 2351 may be inserted into the through hole 2331. The number of protrusions 2351 and the number of through holes 2331 may correspond to each other. A foaming portion FM may be provided so that the center of the main frame 330 contacts the rear surface of the inner plate 350.

An end of the protrusion 2351 may include an extension 2351a. The extension 2351a may be bent from one end of the protrusion 2351 and may contact the rear surface of the main frame 330 at the periphery of the through hole 2331. Hence, a movement of the main frame 330 in the thickness direction can be constrained and/or restricted. It is a matter of course that a movement of the inner plate 350 can be constrained and/or restricted by the main frame 330.

A plurality of such coupling structures may be provided along at least one direction. Hence, not only the movements of the main frame 330 and the inner plate 350 in the thickness direction but also their movements in the vertical and horizontal directions can be constrained and/or restricted. Since embodiments of the present disclosure do not use a separate adhesive member, such as a tape, for fixing the case members, they can prevent a problem in that the coupling strength is reduced depending on changes in temperature/humidity in the use environment and/or the manufacturing environment.

Referring to FIG. 11, the main frame 330 and the middle frame 370 may be coupled through one coupling structure. The corresponding coupling structure may be applied correspondingly to a lower end of the display device. In other words, the corresponding coupling structure may be applied corresponding to the second long side LS2 of the display device. In other words, the corresponding coupling structure may be applied corresponding to one side of the display device in which the member layer ML and the openings OA1 and OA2 are provided.

The main frame 330 may include one or more protrusions 3331 that protrude from a side end toward the rear. The base portion 373 of the middle frame 370 may include a through hole 3374 that contacts the rear surface of the main frame 330 at the rear of the main frame 330, and the protrusion 3331 may be inserted into the through hole 3374. The number of protrusions 3331 and the number of through holes 3374 may correspond to each other.

An end of the protrusion 3331 may include an extension 3331a. The extension 3331a may be bent from one end of the protrusion 3331 and may contact the rear surface of the base portion 373 of the middle frame 370 at the periphery of the through hole 3374. Hence, a movement of the middle frame 370 in the thickness direction can be constrained and/or restricted. It is a matter of course that a movement of the main frame 330 can be constrained and/or restricted by the middle frame 370.

A plurality of such coupling structures may be provided along at least one direction. Hence, not only the movements of the main frame 330, the inner plate 350, and the middle frame 370 in the thickness direction but also their movements in the vertical and horizontal directions can be constrained and/or restricted. Since embodiments of the present disclosure do not use a separate adhesive member, such as a tape, for fixing the case members, they can prevent a problem in that the coupling strength is reduced depending on changes in temperature/humidity in the use environment and/or the manufacturing environment.

Figure 12:
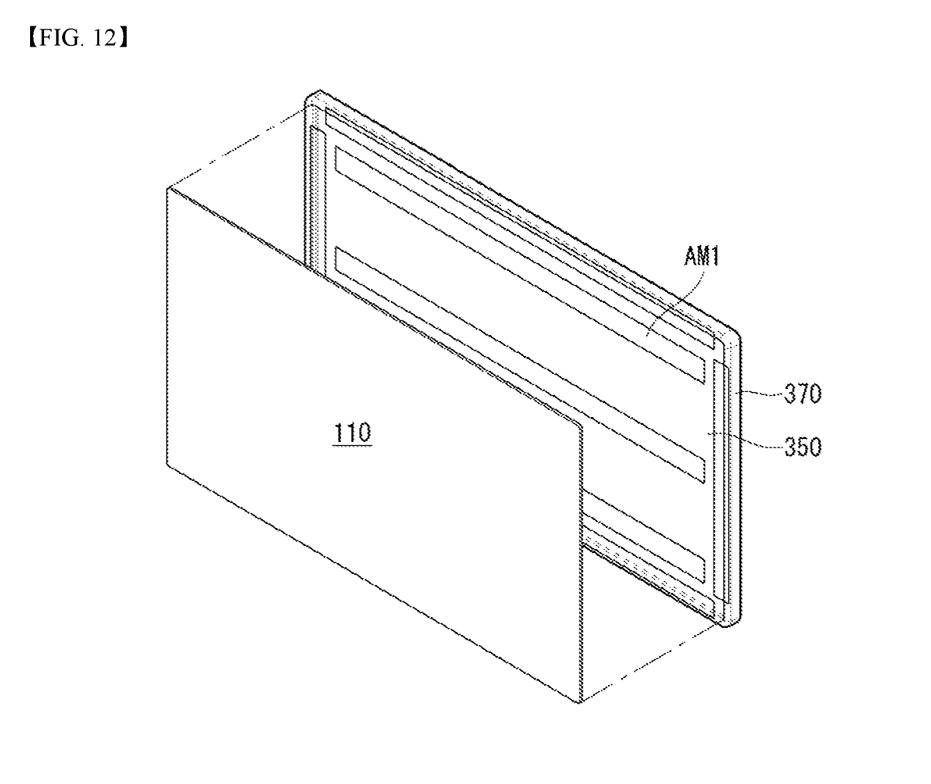
FIGS. 12 and 13 illustrate examples of a coupling structure and an adhesive member according to an embodiment of the present disclosure.
Figure 13:
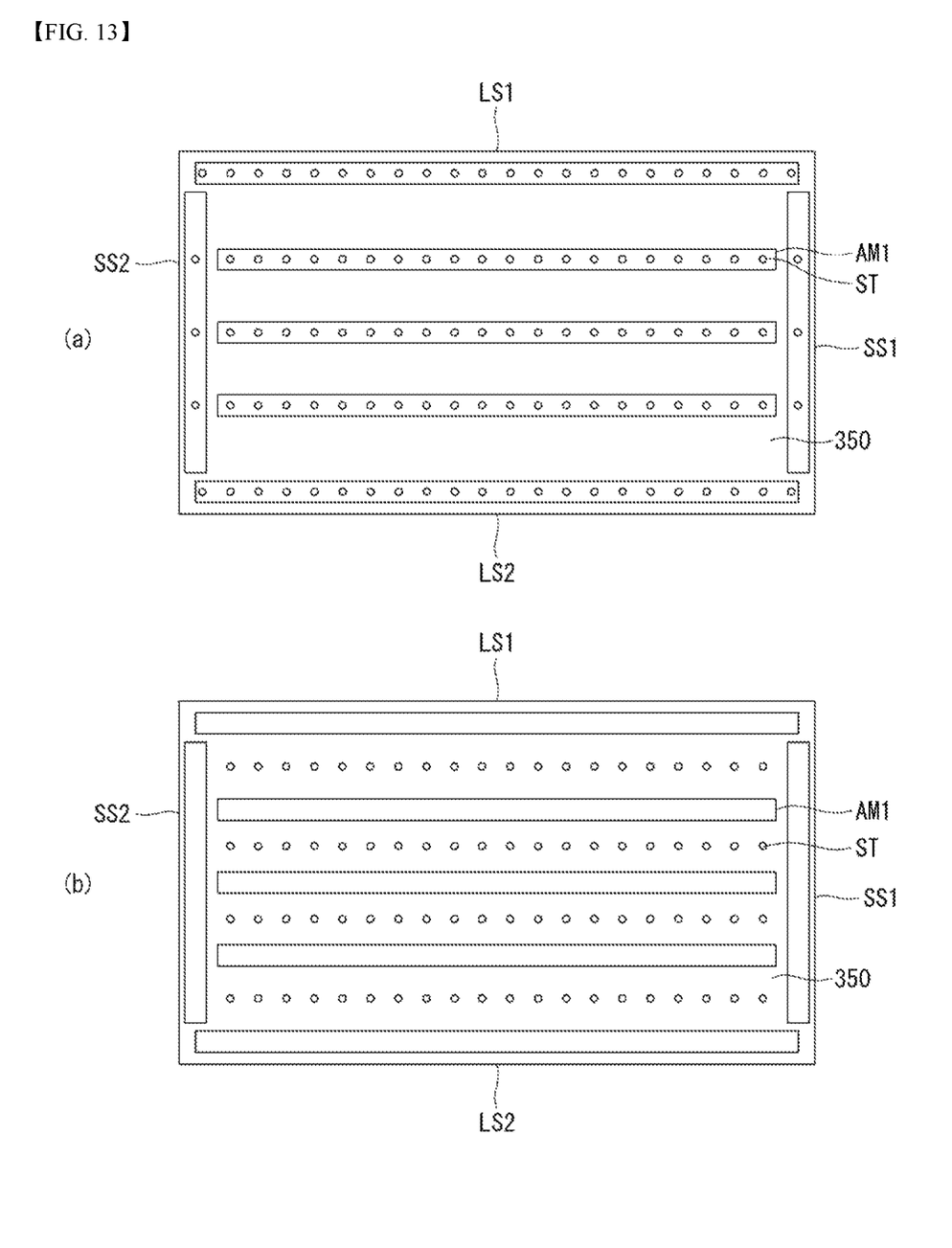

FIGS. 12 and 13 illustrate application examples of a coupling structure and an adhesive member according to an embodiment of the present disclosure.

Referring to FIGS. 12 and 13, a display device according to an embodiment of the present disclosure may include a display panel 110 and a case member. The case member may include a main frame 330, an inner plate 350, and a middle frame 370. The display panel 110 may be assembled with the case members and implemented as one module.

The inner plate 350 may be disposed behind the display panel 110 and support the display panel 110. An adhesive member AM1 may be disposed between the display panel 110 and the inner plate 350. The display panel 110 may be fixed to the inner plate 350 by the adhesive member AM1.

A plurality of adhesive members AM1 may be provided and selectively disposed in necessary positions. As illustrated, the adhesive members AM1 may include, for example, first adhesive members extending in a direction horizontal to first and second long side areas LS1 and LS2, second adhesive members extending in a direction vertical to first and second short side areas SS1 and SS2, and third adhesive members extending in a direction horizontal to a central area.

Referring to FIG. 13(a), the adhesive members AM1 may be disposed to overlap an area in which a coupling structure ST of the case members is disposed. That is, the adhesive member AM1 may be disposed to overlap the protrusion 351 (see FIGS. 5, 6 and 7). For example, when the protrusions 351 (see FIGS. 5, 6 and 7) are sequentially arranged along the horizontal direction, the adhesive member AM1 may be extended in the horizontal direction and disposed to simultaneously cover the protrusions 351 (see FIGS. 5, 6 and 7) arranged along the horizontal direction. When the protrusions 351 (see FIGS. 5, 6 and 7) are sequentially arranged along the vertical direction, the adhesive member AM1 may be extended in the vertical direction and disposed to simultaneously cover the protrusions 351 (see FIGS. 5, 6 and 7) arranged along the vertical direction. Although not shown, the adhesive member AM1 may be provided in a flat plate shape having a predetermined area and disposed to simultaneously cover the protrusions 351 (see FIGS. 5, 6 and 7) arranged in a plurality of rows and a plurality of columns.

When the adhesive member AM1 is disposed to overlap the protrusion 351 (see FIGS. 5, 6 and 7), there is an advantage of preventing a light leakage defect in which light provided in the display panel 110 is exposed to the outside through the protrusions 351 (see FIGS. 5, 6 and 7) and/or the through holes 331 (see FIGS. 5 and 6).

Referring to FIG. 13(b), the adhesive members AM1 may be disposed not to overlap an area in which a coupling structure ST of the case members is disposed. That is, the adhesive member AM1 may be shifted from the protrusion 351 (see FIGS. 5, 6 and 7) in a predetermined direction so that the adhesive member AM1 does not overlap the protrusion 351 (see FIGS. 5, 6 and 7). For example, when the protrusions 351 (see FIGS. 5, 6 and 7) are sequentially arranged in a plurality of rows along the horizontal direction, the adhesive member AM1 may be arranged between the plurality of rows. When the protrusions 351 (see FIGS. 5, 6 and 7) are sequentially arranged in a plurality of columns along the vertical direction, the adhesive member AM1 may be arranged between the plurality of columns.

If there is a risk of a height difference by the coupling structure ST, the height difference can be compensated by disposing the adhesive members AM1 in an area adjacent to the coupling structure ST. Hence, there is an advantage in that a predetermined flatness of the display device 110 can be secured.

Certain embodiments or other embodiments of the present disclosure described above are not mutually exclusive or distinct from each other. Some embodiments or other embodiments of the present disclosure described above may be combined with each other in configuration or function.

The above detailed description is merely an example and is not to be considered as limiting the present disclosure. The scope of the present disclosure should be determined by rational interpretation of the appended claims, and all changes within the equivalent range of the present disclosure are included in the scope of the present disclosure.

The invention claimed is:

1. A display device comprising:
a display panel;
a main frame disposed behind the display panel;
an inner plate positioned between the display panel and the main frame and coupled to the main frame; and
a middle frame including a sidewall facing a side of the display panel, and a base portion extending from the sidewall and facing a rear surface of the main frame at a rear of the main frame,
wherein the main frame has at least one first through hole that passes through a thickness of the main frame at a first area of the display device,
wherein the main frame has at least one second through hole that passes through the thickness of the main frame at a second area of the display device,
wherein the base portion has at least one third through hole that passes through a thickness of the base portion at the second area, and
wherein the inner plate includes:
at least one first protrusion having a portion in the at least one first through hole of the main frame;
a first extension extending from an end of the at least one first protrusion along an outward direction of a central axis of the at least one first protrusion;
at least one second protrusion having a portion in the at least one second through hole and having a portion in the at least one third through hole at the second area; and
a second extension extending from an end of the at least one second protrusion along an outward direction of a central axis of the at least one second protrusion.

2. The display device of claim 1, wherein the first extension contacts the rear surface of the main frame.

3. The display device of claim 1, wherein the second extension of the inner plate contacts a rear surface of the base portion.

4. The display device of claim 1, wherein the base portion has at least one fourth through hole that passes through the thickness of the base portion at a third area of the display device, and
wherein the main frame includes:
at least one third protrusion having a portion in the at least one fourth through hole; and
a third extension extending from an end of the at least one third protrusion along an outward direction of a central axis of the at least one third protrusion.

5. The display device of claim 4, wherein the third extension of the main frame contacts a rear surface of the base portion.

6. The display device of claim 4, further comprising:
a source printed circuit board (PCB) positioned at the rear surface of the main frame; and
a member layer configured to electrically connect the display panel to the source PCB,
wherein the main frame and the base portion of the middle frame each has a first opening and a second opening through which the member layer passes,
wherein the at least one third protrusion is disposed to avoid the first opening and the second opening of the main frame and the first opening and the second opening of the base portion.

7. The display device of claim 4, wherein at least the at least one first protrusion penetrates the at least one first through hole, the at least one second protrusion penetrates the at least one second through hole and the at least one third through hole, or the at least one third protrusion penetrates the at least one fourth through hole, in a thickness direction.

8. The display device of claim 4, wherein the display device has:
a first long side area;
a second long side area opposite the first long side area;
a first short side area abutting an end of the first long side area and an end of the second long side area;
a second short side area opposite the first short side area; and
a central area between the first and second long side areas and the first and second short side areas,
wherein the first area is positioned at the central area,
wherein the second area is positioned at at least one of the first long side area, the first short side area, or the second short side area, and
wherein the third area is positioned at the second long side area.

9. The display device of claim 8, further comprising adhesive members between the display panel and the inner plate,
wherein the adhesive members include first adhesive members extending along a first direction at the first and second long side areas, second adhesive members extending along a second direction at the first and second short side areas, and third adhesive members extending along the first direction at the central area.

10. The display device of claim 9, wherein the at least one first protrusion, the at least one second protrusion, and the at least one third protrusion overlap the adhesive members.

11. The display device of claim 9, wherein the at least one first protrusion, the at least one second protrusion, and the at least one third protrusion are positioned between the adhesive members.

12. A display device comprising:
a display panel;
a main frame disposed behind the display panel; and
an inner plate positioned between the display panel and the main frame and coupled to the main frame,
wherein the inner plate includes:
at least one first protrusion protruding toward the main frame; and
an extension extending from an end of the at least one first protrusion along an outward direction of a central axis of the at least one first protrusion,
wherein the main frame includes a second protrusion having a groove formed along an outer circumference of the at least one first protrusion, and
wherein the extension of the inner plate has a portion in the groove of the second protrusion of the main frame.

\* \* \* \* \*